(12) United States Patent
Sassolini et al.

(10) Patent No.: US 7,399,652 B2
(45) Date of Patent: Jul. 15, 2008

(54) METHOD FOR MANUFACTURING A MICRO-ELECTRO-MECHANICAL DEVICE, IN PARTICULAR AN OPTICAL MICROSWITCH, AND MICRO-ELECTRO-MECHANICAL DEVICE THUS OBTAINED

(75) Inventors: Simone Sassolini, Sansepolcro (IT); Mauro Marchi, Milan (IT); Marco Del Sarto, Massa (IT); Lorenzo Baldo, Bareggio (IT)

(73) Assignee: STMicroelectronics S.R.L. (IT)

( * ) Notice: Subject to any disclaimer, the term of this patent is extended or adjusted under 35 U.S.C. 154(b) by 464 days.

(21) Appl. No.: 10/821,263

(22) Filed: Apr. 8, 2004

(65) Prior Publication Data

US 2004/0256686 A1 Dec. 23, 2004

(30) Foreign Application Priority Data

Apr. 8, 2003 (IT) ............................ TO2003A0269

(51) Int. Cl.
*H01L 21/58* (2006.01)
(52) U.S. Cl. .............................. 438/27; 438/31; 438/42; 438/118; 438/455; 438/456; 438/459; 257/E21.122; 216/2
(58) Field of Classification Search ................. 438/27, 438/31, 42, 118, 455, 456, 459; 257/E21.122; 216/2
See application file for complete search history.

(56) References Cited

U.S. PATENT DOCUMENTS

| | | | | |
|---|---|---|---|---|
| 6,143,583 A | * | 11/2000 | Hays ............................. | 438/39 |
| 6,504,253 B2 | * | 1/2003 | Mastromatteo et al. ..... | 257/758 |
| 6,638,836 B1 | * | 10/2003 | Murari et al. ............... | 438/459 |
| 6,689,627 B2 | * | 2/2004 | Mottura et al. ............... | 438/24 |
| 6,713,367 B2 | * | 3/2004 | Solgaard et al. ............. | 438/459 |
| 6,758,983 B2 | * | 7/2004 | Conant et al. .................. | 216/2 |
| 6,794,271 B2 | * | 9/2004 | Harris et al. ................ | 438/456 |
| 6,872,319 B2 | * | 3/2005 | Tsai ............................... | 216/2 |
| 6,984,571 B1 | * | 1/2006 | Enquist ....................... | 438/459 |
| 2004/0077154 A1 | * | 4/2004 | Nagarajan et al. ........... | 438/455 |
| 2004/0152229 A1 | * | 8/2004 | Najafi et al. .................. | 438/52 |

(Continued)

FOREIGN PATENT DOCUMENTS

JP 10-289876 10/1998

OTHER PUBLICATIONS

Korean Office Action dated Dec. 16, 2004 (and English translation of relevant portion).

*Primary Examiner*—George Fourson
(74) *Attorney, Agent, or Firm*—Lisa K. Jorgenson; Harold H. Bennett, II; Seed IP Law Group PLLC

(57) ABSTRACT

A method for manufacturing a micro-electro-mechanical device, which has supporting parts and operative parts, includes providing a first semiconductor wafer, having a first layer of semiconductor material and a second layer of semiconductor material arranged on top of the first layer, forming first supporting parts and first operative parts of the device in the second layer, forming temporary anchors in the first layer, and bonding the first wafer to a second wafer, with the second layer facing the second wafer. After bonding the first wafer and the second wafer together, second supporting parts and second operative parts of said device are formed in the first layer. The temporary anchors are removed from the first layer to free the operative parts formed therein.

15 Claims, 12 Drawing Sheets

U.S. PATENT DOCUMENTS

2005/0048688 A1* 3/2005 Patel et al. .................... 438/53
2005/0095813 A1* 5/2005 Zhu et al. ................... 438/459
2006/0057836 A1* 3/2006 Nagarajan et al. ........... 438/622

* cited by examiner

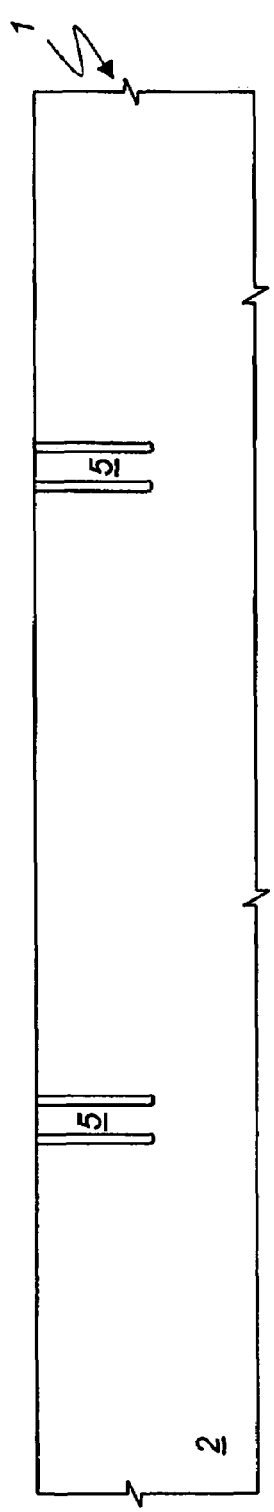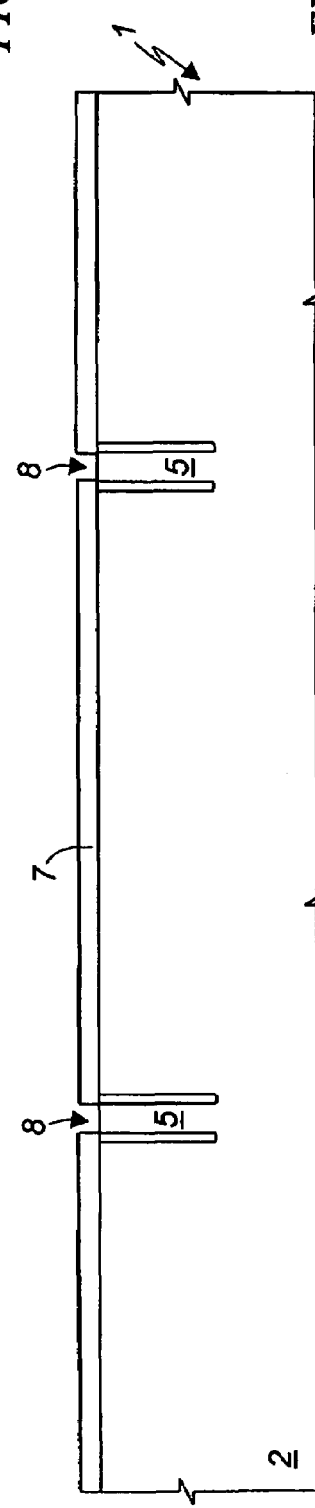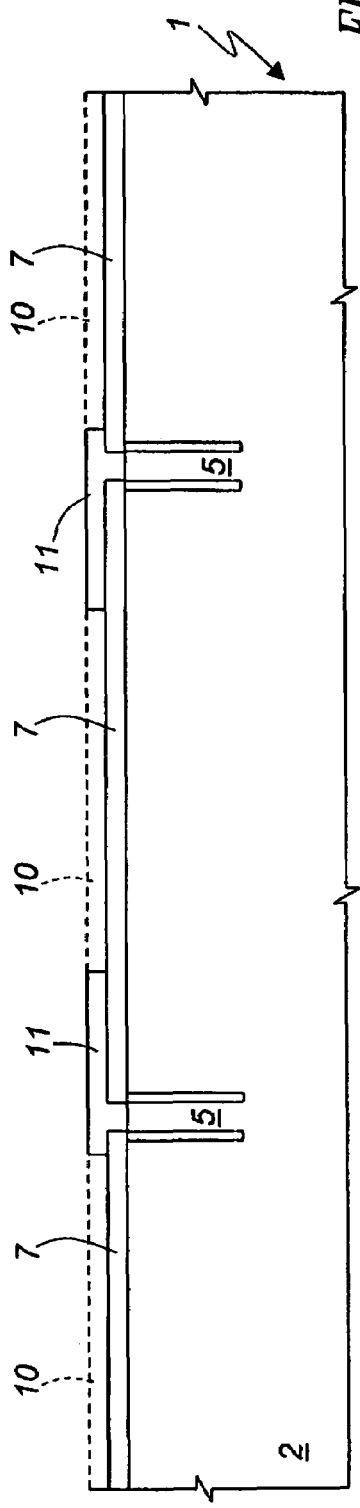

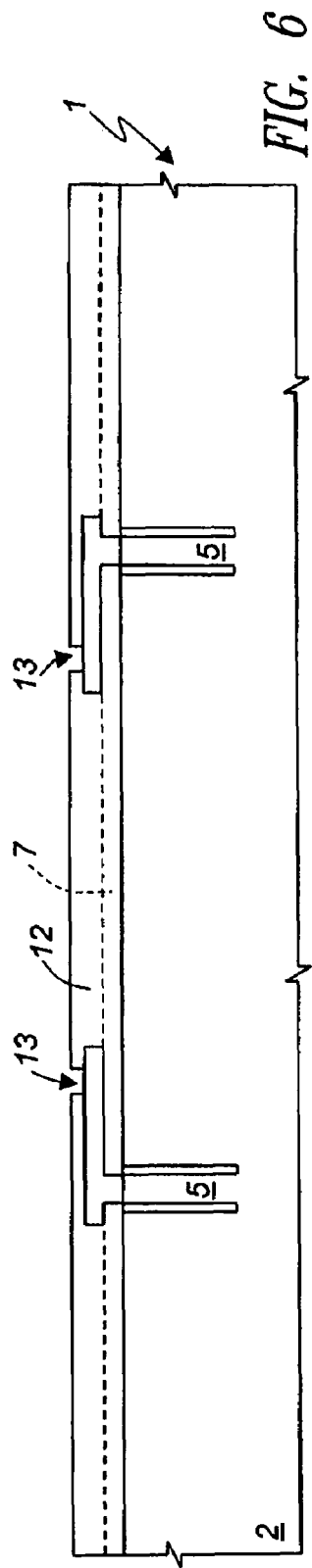
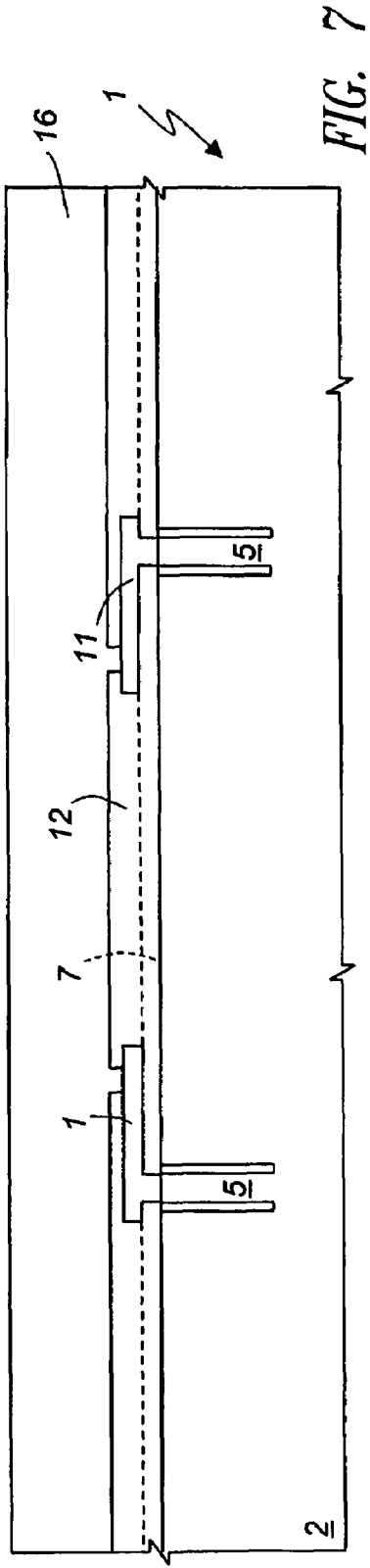
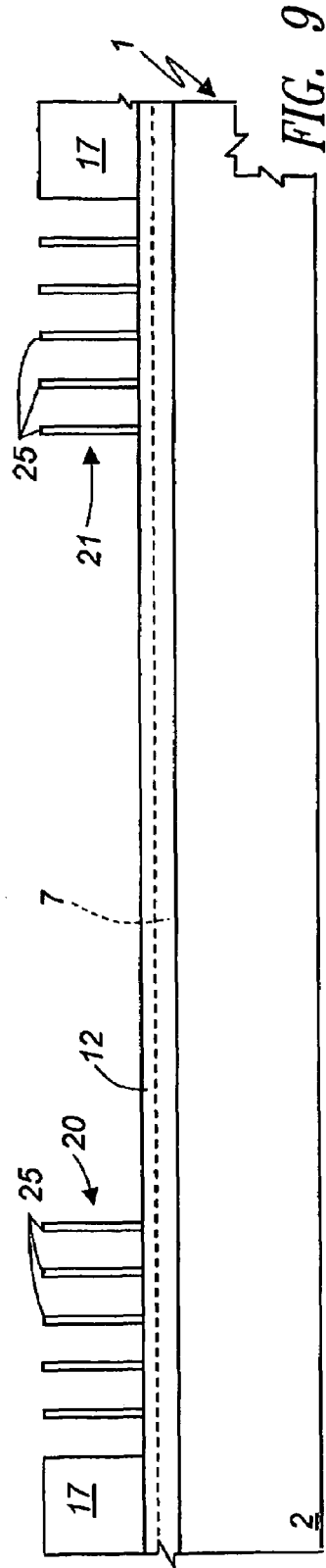

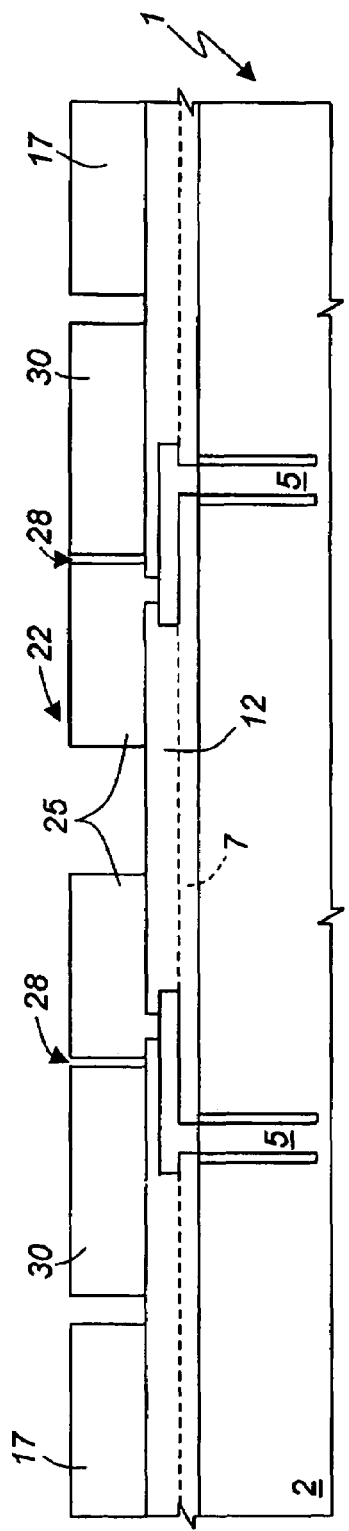
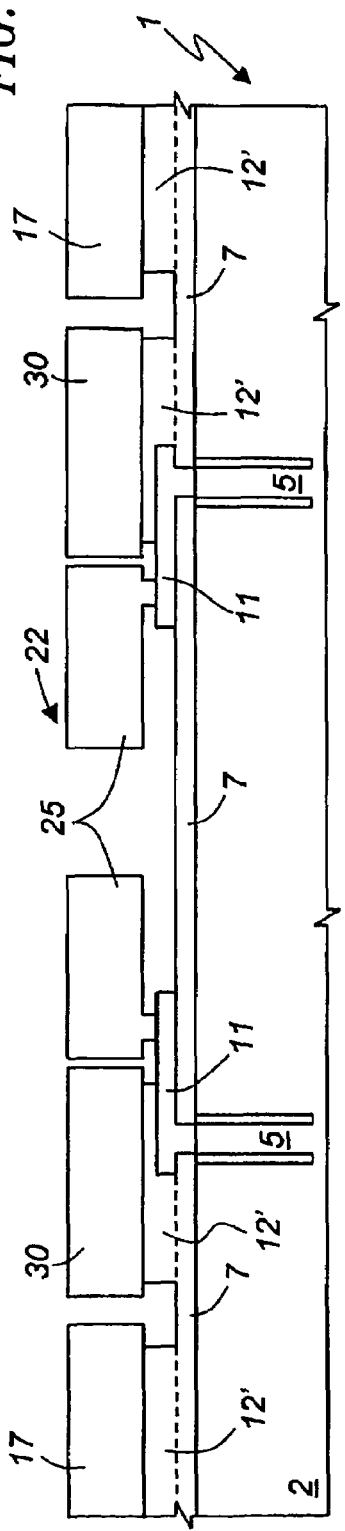
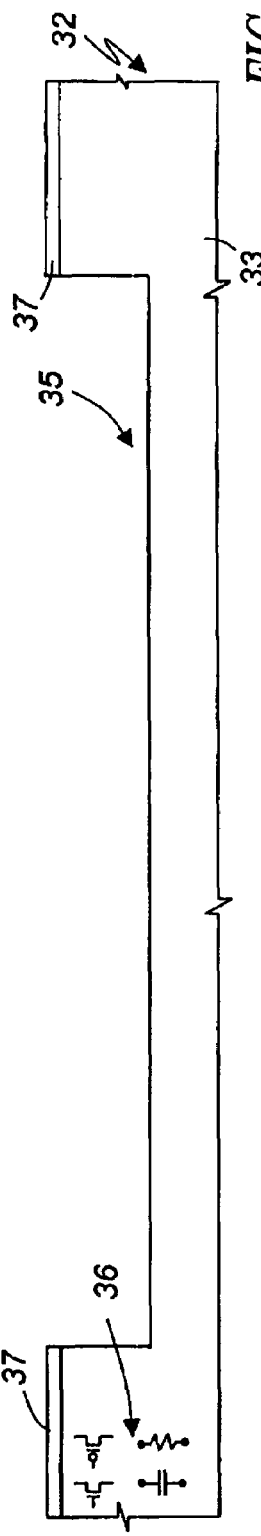
FIG. 10
FIG. 11
FIG. 12

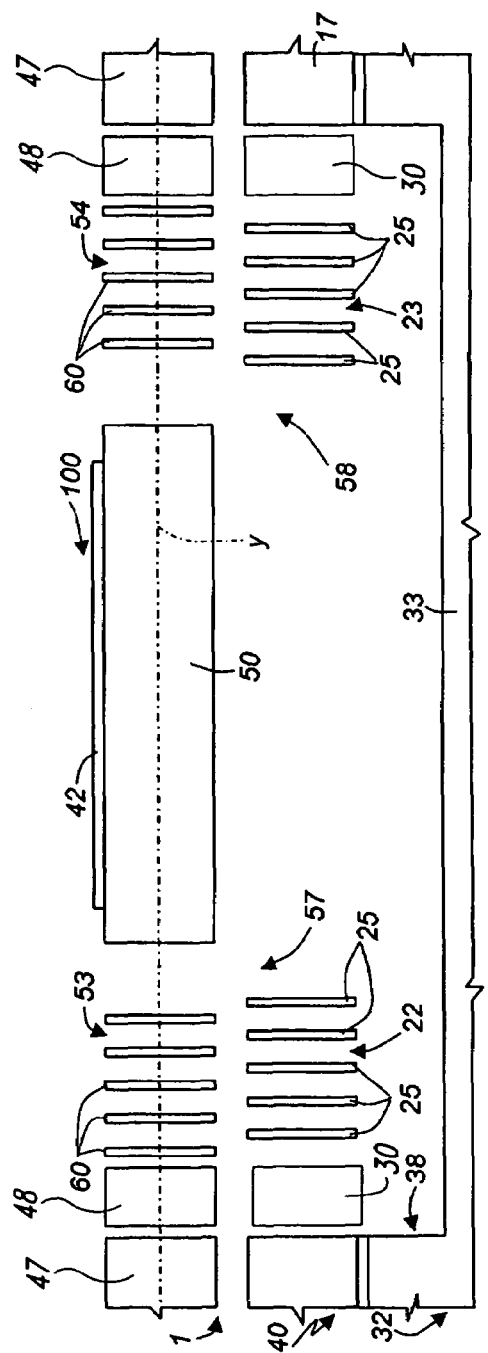
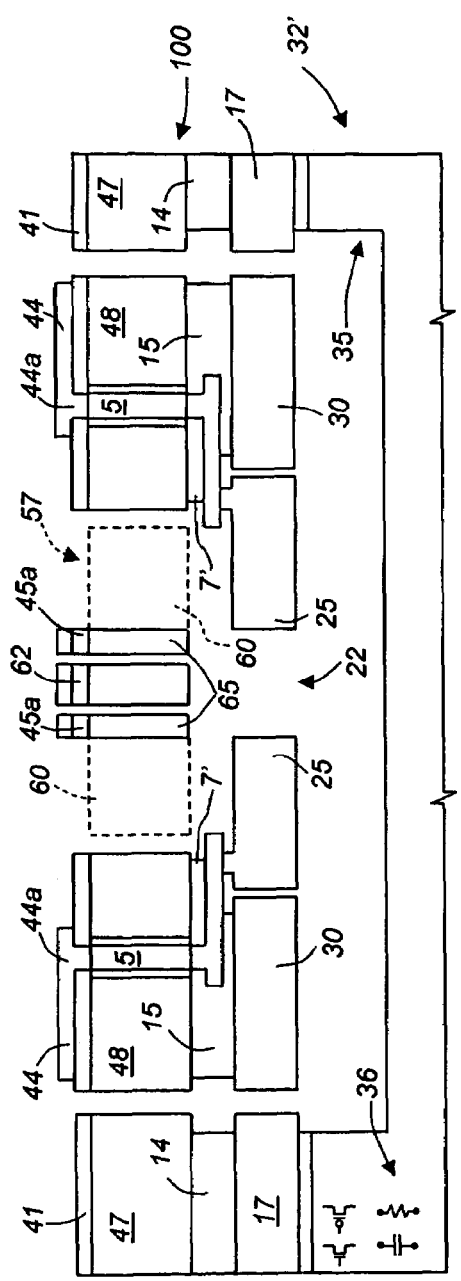
FIG. 19
FIG. 21

METHOD FOR MANUFACTURING A MICRO-ELECTRO-MECHANICAL DEVICE, IN PARTICULAR AN OPTICAL MICROSWITCH, AND MICRO-ELECTRO-MECHANICAL DEVICE THUS OBTAINED

BACKGROUND OF THE INVENTION

1. Field of the Invention

The present invention relates to a method for manufacturing a micro-electro-mechanical device, in particular an optical microswitch, and a micro-electro-mechanical device thus obtained.

2. Description of the Related Art

There are known different methods for manufacturing micro-electro-mechanical structures, such as, for example, micromirror optical selectors, micromotors or microactuators that can be used for fine control of the position of read/write heads in hard-disk drivers.

In particular, the use of two distinct semiconductor wafers has been recently proposed to form complex microstructures and to prevent burdensome processing steps: a first wafer having at least two layers is designed to house the microstructures (fixed parts and moving parts), while a second wafer operates as support for the microstructures and integrates the circuits for control of the microstructures.

U.S. Pat. No. 6,638,836 describes a manufacturing method of the type referred to above, in the case in point for the construction of a microactuator. In this case, the microstructure is formed in part in a substrate and in part in a polysilicon layer of the first wafer. More precisely, an encapsulation structure is initially defined by digging trenches in the substrate, which are then filled with sacrificial silicon oxide. Then, on top of the substrate there is grown the polysilicon layer, where a fixed part and a moving part of the microstructure are defined by digging further trenches. In this way, the moving part is temporarily immobilized to prevent any breakage during the subsequent manufacturing steps. The first wafer and the supporting wafer are then bonded to one another, so as to form a composite wafer with the polysilicon layer of the first wafer facing the supporting wafer. The substrate of the first wafer is then thinned out, until reaching the previously dug trenches, and the sacrificial silicon oxide is removed, freeing the moving part. Using a third service wafer for further protection, the composite wafer is cut into dice, which are provided with protective chips that are finally removed.

The above known solution, albeit representing a considerable improvement over the previous solutions, has some limitations.

Moreover, the solution proposed is not suited for making microstructures in which the moving part, instead of translating or rotating in a plane about an axis, must rotate about two axes that are not parallel and is thus inclined with respect to the fixed part. On the other hand, the normal operation of certain types of devices, such as micromirror optical selectors, envisages precisely modification of the orientation of the moving part, by rotating the moving part itself about axes that are not perpendicular to its surface. In cases of this sort, it is necessary to envisage a rather ample clearance, to prevent the fixed part from interfering with the moving part. The trenches that separate the fixed part from the moving part must therefore be of adequate width, sometimes tens of microns. However, the step of filling trenches that are so wide, which is normally obtained by thermal oxidation, is problematical and can cause serious drawbacks, especially for the trenches dug in the substrate. In fact, the thermal oxide does not always grow sufficiently to fill up the trenches, where recesses or cavities may remain. Consequently, the polysilicon layer, which is subsequently grown, insinuates also within these recesses and cavities, is irregular, and can cause both electrical and mechanical malfunctioning. In addition, it is known that the thermal oxide grows also within the silicon, in a way, however, that is difficult to control: a long thermal oxidation step is at the expense of precision in the definition of the microstructures, which, however, is a requirement of primary importance.

A further drawback may occur when it is necessary to fill a high number of trenches very close to one another, such as the trenches that separate the electrodes of the moving part from the electrodes of the fixed part. In this case, the wafer may be deformed owing to the high internal stresses due to the growth of the thermal oxide.

BRIEF SUMMARY OF THE INVENTION

An aspect of the invention provides a method for manufacturing a micro-electro-mechanical device and a micro-electro-mechanical device.

According to one embodiment of the invention, a method for manufacturing a micro-electro-mechanical device, which has supporting parts and operative parts, is provided, including providing a first semiconductor wafer. The first wafer has a first layer of semiconductor material and a second layer of semiconductor material, arranged on the first layer. The method further includes forming first supporting parts and first operative parts of the device in the second layer, bonding the first wafer to a second wafer, with the second layer facing the second wafer, and forming, after the bonding step, second supporting parts and second operative parts of the device in the first layer.

According to another embodiment of the invention, a method for manufacturing a micro-electro-mechanical device is provided, including defining, in a first semiconductor substrate, a plurality of anchor regions, bonding a second semiconductor substrate to the first substrate, forming, after the bonding and defining steps, a rotor region in the first semiconductor substrate such that the anchor regions remain between the rotor region and an outer region of the first substrate, and removing the anchor regions such that the rotor region is free to move with respect to the outer region and the second substrate.

The method may further include forming a layer of semiconductor material on the first semiconductor substrate, and forming electrostatic stator elements in the layer of semiconductor material. In this case, the bonding step includes bonding the second semiconductor substrate to the layer of semiconductor material, and the forming the rotor region step includes forming electrostatic rotor elements in the first semiconductor substrate.

According to another embodiment of the present invention, there is provided a micro-electro-mechanical device. The device includes a first layer of semiconductor material and a second layer of semiconductor material fixed to a base, first supporting parts and first operative parts formed in the second layer, second supporting parts and second operative parts formed in the first layer, and interconnection lines at least partially arranged between the first layer and the second layer, and through interconnections extending through said the layer and electrically connected to the interconnection lines.

According to an additional embodiment, a micro-electro-mechanical device is provided, including a first layer of semiconductor material lying in a first plane, a plurality of stator elements formed in the first layer and having a comb-finger configuration, a second layer of semiconductor material coupled to the first layer and lying in a second plane, parallel to the first plane, and a rotor and a plurality of rotor elements formed in the second layer and having a comb-finger configuration, the plurality of rotor elements staggered with respect to the plurality of stator elements.

BRIEF DESCRIPTION OF THE DRAWINGS

For an understanding of the present invention preferred embodiments thereof are now described, purely by way of non-limiting example, with reference to the attached drawings, in which:

FIGS. 2-4 are cross-sectional views through the first wafer of FIG. 1, along the line II-II of FIG. 1, in subsequent manufacturing steps;

FIGS. 6 and 7 are views similar to FIG. 4, in subsequent manufacturing steps;

FIG. 9 is a cross-section through the first wafer of FIG. 8, taken along line IX-IX of FIG. 8;

FIGS. 10 and 11 are cross-sections through the first wafer of FIG. 8, taken along line X-X of FIG. 8, in subsequent manufacturing steps;

FIG. 12 is a cross-section view through a second semiconductor wafer;

FIGS. 18 and 19 are cross-sections through the composite wafer of FIG. 17, taken along lines XVIII-XVIII and XIX-XIX, respectively;

FIG. 21 is a cross-section of a die obtained cutting the composite wafer of FIG. 17, taken along the line XXI-XXI of FIG. 17.

DETAILED DESCRIPTION OF THE INVENTION

Figure 1:
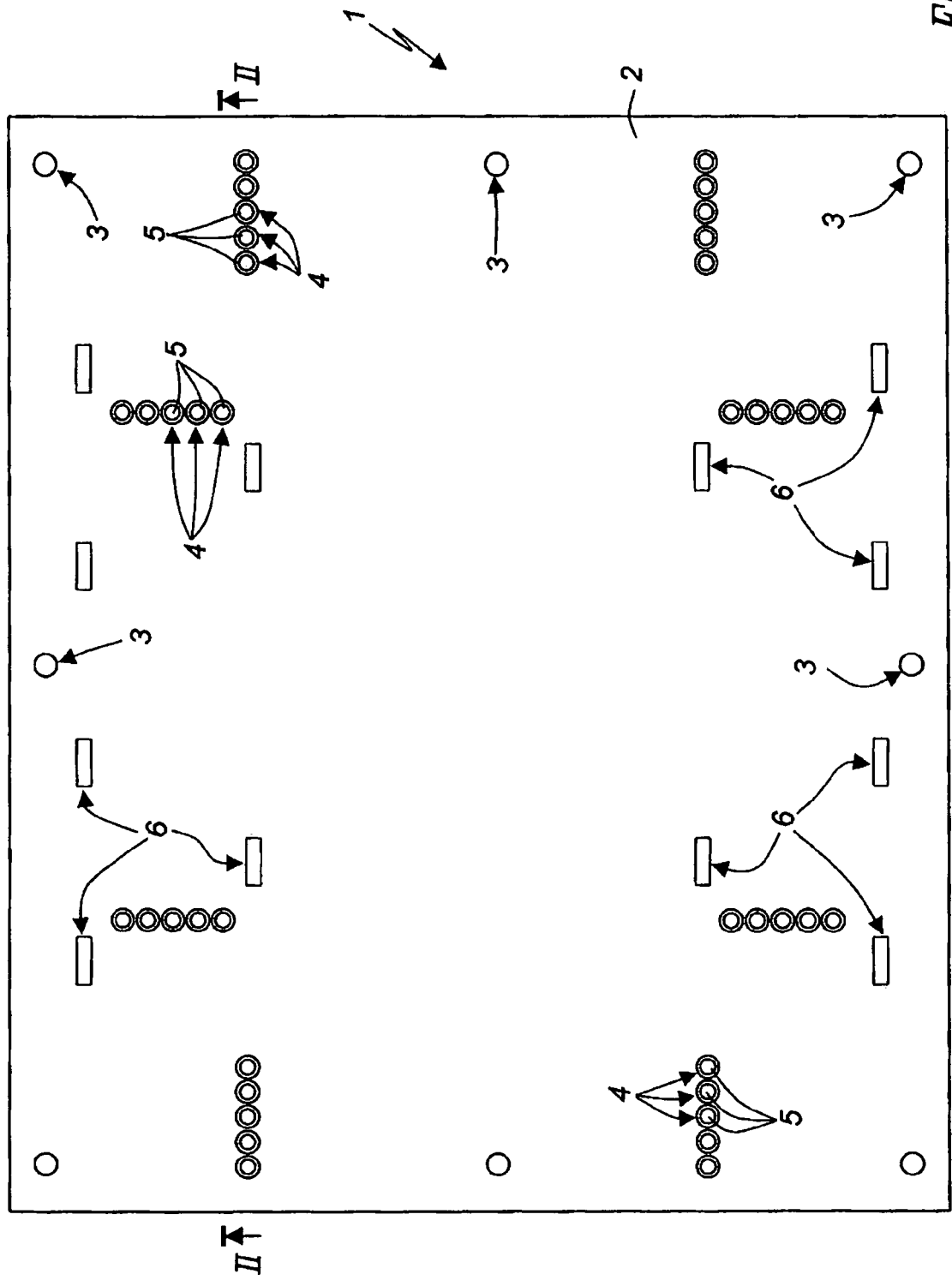
FIG. 1 is a top plan view of a first semiconductor wafer in an initial manufacturing step according to the present invention.

With reference to FIG. 1, in a first semiconductor wafer 1, having a substrate 2, for example of N-type monocrystalline silicon, a first trench etch, which is markedly anisotropic, is initially carried out. In this step, reference trenches 3 are dug, for defining alignment marks for the subsequent processing steps, as well as annular trenches 4, delimiting silicon plugs 5, designed to form through interconnections, as clarified hereinafter, and third trenches 6, for forming temporary anchoring points. The trenches 3, 4, 6 have preferably a depth of approximately 50 µm.

Subsequently, the trenches 3, 4, 6 are filled with dielectric material; to this end, an insulating layer not shown herein, for example silicon oxide, is deposited on top of the first wafer 1 and then removed. The plugs 5 are thus laterally isolated from the surrounding silicon of the substrate 2. Furthermore, within the third trenches 6 sacrificial anchoring regions 9 (FIG. 9) are formed. Alternatively, more than one filling layer could be used, at least one of which must in any case be of dielectric material.

Figure 5:
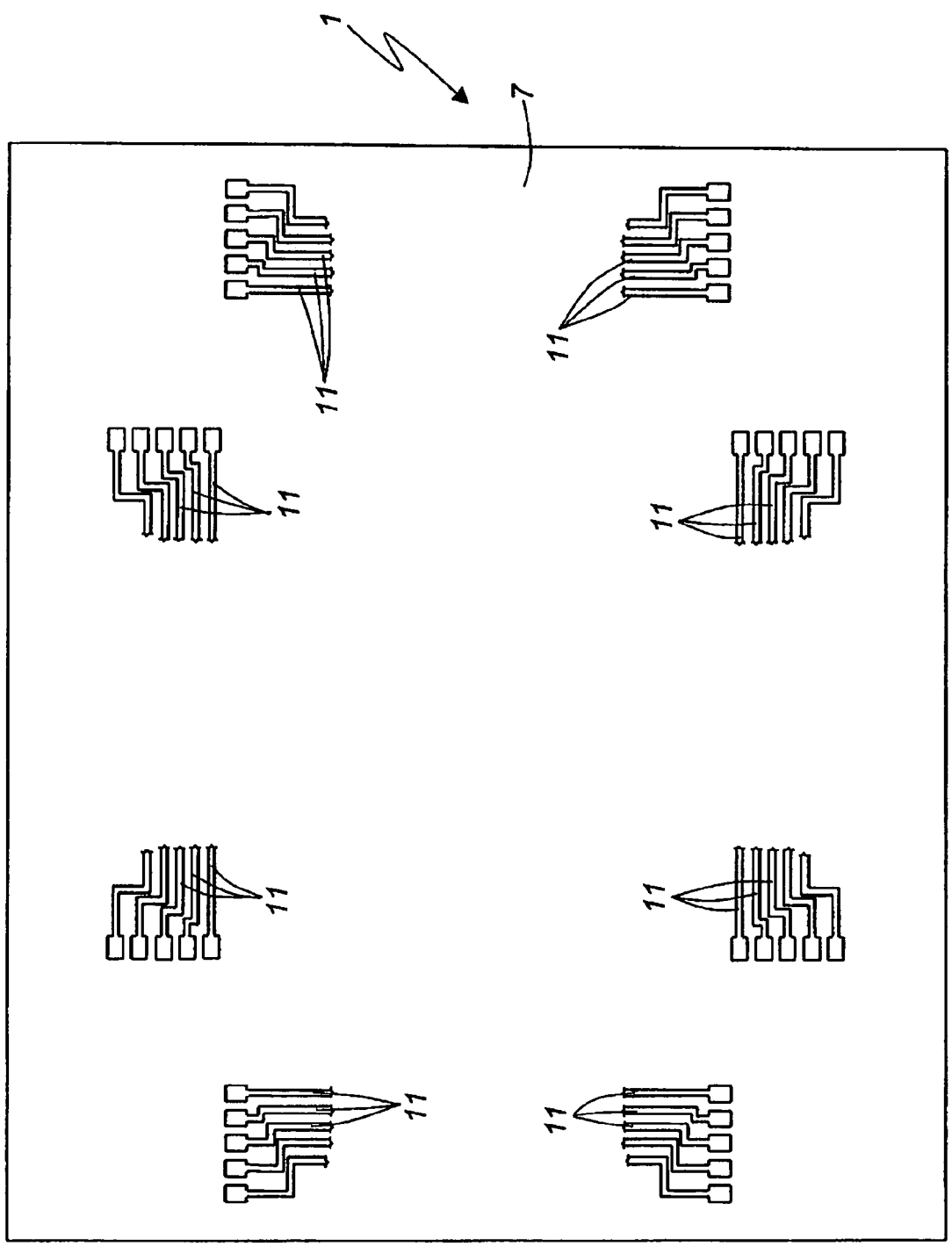
FIG. 5 is a top plan view of the first wafer of FIG. 4.

As illustrated in FIG. 3, a dielectric layer 7, once again of silicon oxide, is deposited on top of the first wafer 1 and shaped by means of a masked etch. In this step, windows are formed for contacts 8, in particular above the plugs 5. Then a conductive layer 10 of polysilicon is deposited, and penetrates into the openings 8 and contacts the plugs 5. As illustrated in FIGS. 4 and 5, the conductive layer 10 is defined by a step of masked etch, so as to form interconnection lines 11, which have first ends connected to respective plugs 5.

Next (FIG. 6), a sacrificial layer 12 of silicon oxide is deposited and shaped; in particular, openings 13 are formed, which uncover second ends of the interconnection lines 11.

After a layer of seeds of polysilicon (not illustrated) has been deposited, a polysilicon layer 16 is grown, for example having a thickness of 50 µm, which penetrates also within the openings 13 (FIG. 7). The polysilicon layer 16 is hence mechanically connected to the substrate 2 through the sacrificial layer 12 and the dielectric layer 7 and is moreover electrically connected to the plugs 5 through the interconnection lines 11.

Figure 8:
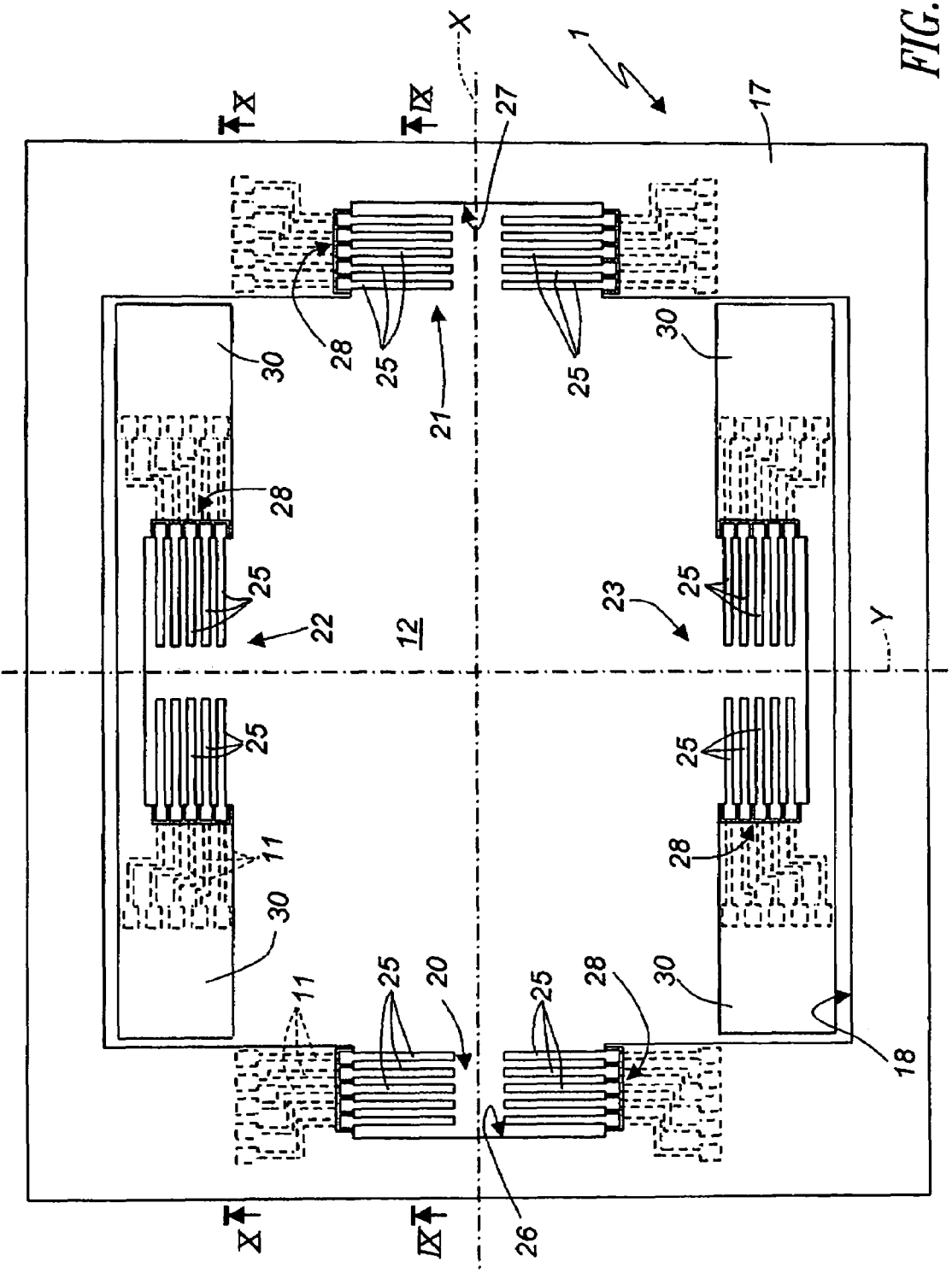
FIG. 8 is a top plan view of the first wafer of FIG. 7, in a subsequent manufacturing step.

The polysilicon layer 16 is then etched with a second trench etch, which is markedly anisotropic and which is terminated after the sacrificial layer 12 has been reached. Hence, where etched, the silicon is removed for the entire thickness of the polysilicon layer 16. As illustrated in FIG. 8, a first cavity 18, which is basically rectangular, is dug centrally in the polysilicon layer 16. More precisely, the first cavity 18 is delimited at the bottom by the sacrificial layer 12 and laterally by a residual portion of the polysilicon layer 16, which forms a first external supporting frame 17 fixed to the substrate 2. In this step, supporting parts and operative parts are formed in the polysilicon layer 16. In detail, first, second, third and fourth stator assemblies 20-23, each of which comprises a plurality of respective stator electrodes 25, are formed starting from the polysilicon layer 16 (see also FIGS. 9 and 10). Furthermore, thin insulation trenches 28 (for example, with a width of to 2 µm) are dug, which traverse the entire thickness of the polysilicon layer 16 and separate the adjacent stator electrodes 25 from one another. FIG. 8 illustrates with a dashed line also the interconnection lines 11, each of which connects one of the stator electrodes 25 with a respective plug 5 (see also FIG. 10).

The first and second stator assemblies 20, 21 are housed in respective recesses 26, 27, which are formed on opposite sides of the first outer frame 17 and are open towards the first cavity 18. The stator electrodes 25 of the first and second stator assemblies 20, 21 are oriented perpendicularly with respect to a first axis X, which is parallel to the faces 1a, 1b of the first wafer 1, and are comb-fingered, preferably arranged opposite to one another in pairs. The first axis X is also an axis of symmetry of the first and second stator assemblies 20, 21. Moreover, the stator electrodes 25 of the first and second stator assemblies 20, 21 project cantilevered from the periphery towards the inside of the respective recesses 26, 27.

The third and fourth stator assemblies 22, 23 are housed within the first cavity 18 and within respective protective structures 30, fixed to the substrate 2. The stator electrodes 25 of the third and fourth stator assemblies 22, 23 are oriented perpendicularly with respect to a second axis Y, which is in turn orthogonal to the first axis X, and are comb-fingered, preferably arranged opposite to one another in pairs. The second axis Y is also an axis of symmetry of the third and fourth stator assemblies 22, 23. Moreover, the stator electrodes 25 of the third and fourth stator assemblies 22, 23 project cantilevered from the respective protective structures 30 towards one another.

Next, the sacrificial layer 12 is etched. In greater detail, the sacrificial layer 12 is removed where it is exposed and is only partially removed underneath the first outer frame 17 and the protective structures 30, which thus remain bonded to the substrate 2. In this step, also the dielectric layer 7 can be in part etched, but it is not removed completely. With reference to FIG. 12, a second semiconductor wafer 32, having a substrate 33, is subjected to preliminary processing steps and prepared for bonding with the first wafer 1. In the substrate 33 of the second wafer 32, in particular, a second cavity 35 is dug, having approximately the dimensions of the first cavity 18. Then, a control circuit 36 is formed, here indicated schematically by symbols of active and passive electronic components. Finally, a bonding layer 37 is spread on the second wafer 32.

Figure 13:
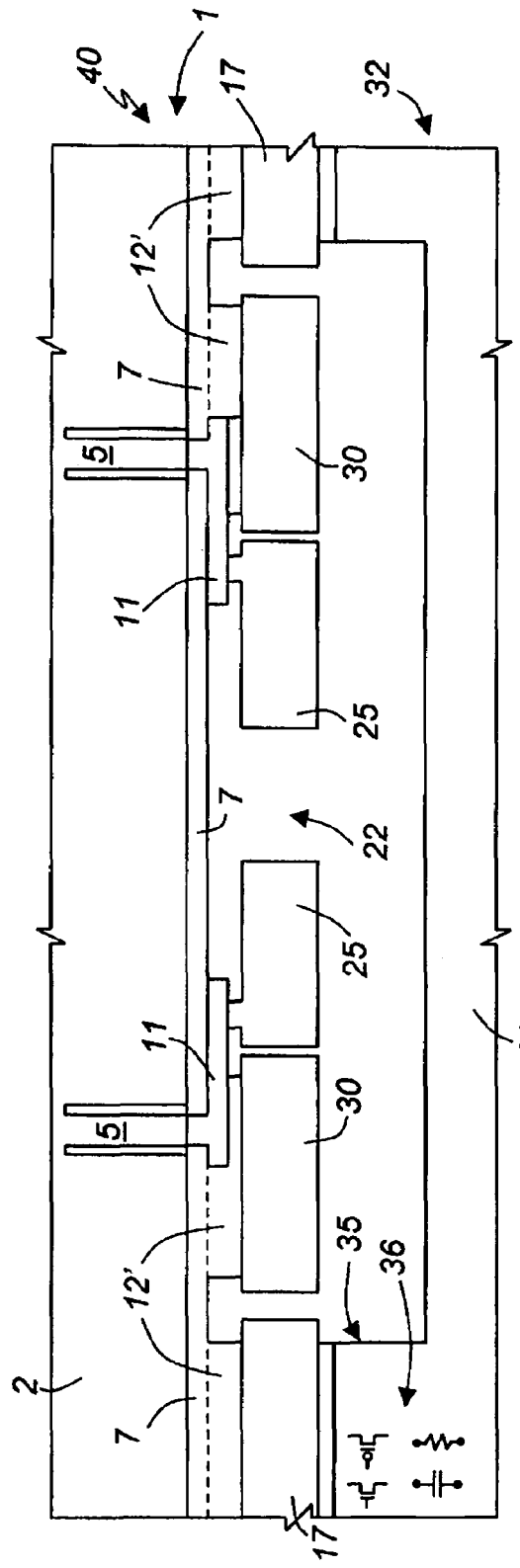
FIGS. 13-15 are cross-sections through a composite wafer formed from the first wafer of FIG. 11 and the second wafer of FIG. 12, in subsequent manufacturing steps.

As illustrated in FIG. 13, the first wafer 1 and the second wafer 32 are then bonded to one another, so as to form a composite wafer 40, in which the second wafer 32 functions as a support. In particular, the polysilicon layer 16 of the first wafer 1 faces the second wafer 32, and the first cavity 18 is centered with respect to the second cavity 35.

Figure 14:
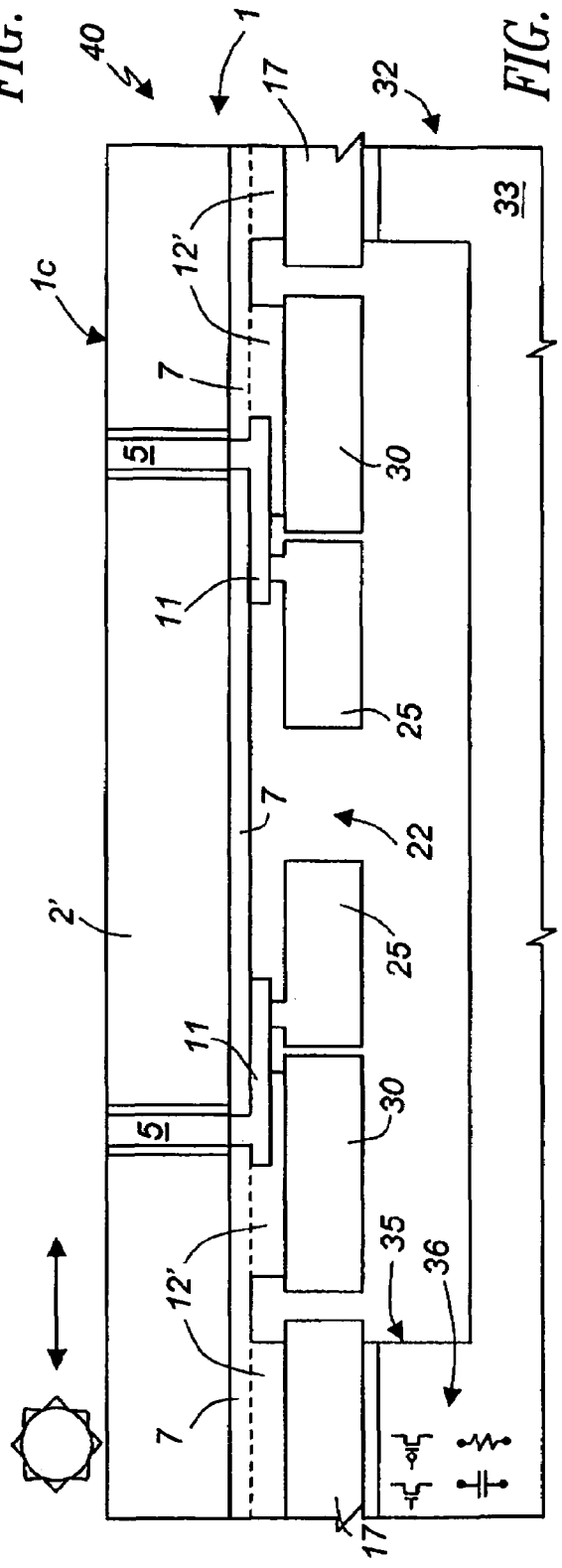

Next (FIG. 14), the substrate 2 of the first wafer 1 is thinned out by lapping, until reaching the reference trenches 3, the plugs 5, which thus define through plugs, and the sacrificial anchoring regions 9 (not visible in FIG. 14), which thus extend up to a face 1c of the residual portion 2' of the substrate 2.

Figure 15:
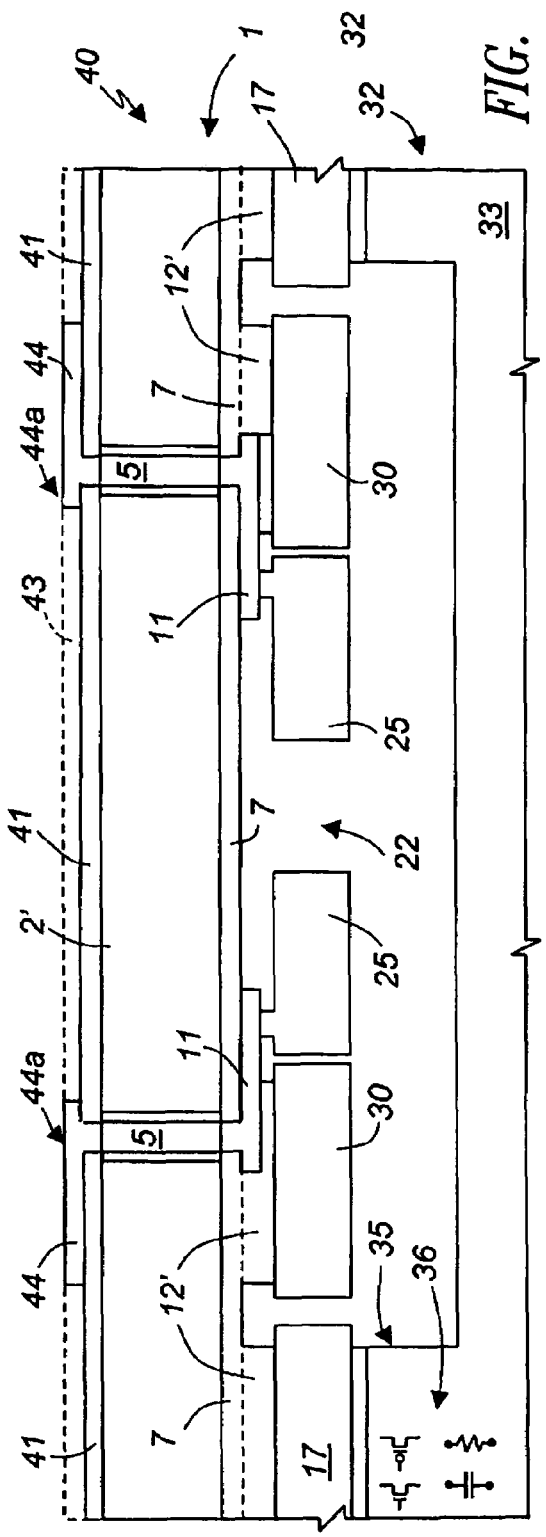

Then (FIG. 15), the face 1c is coated with an insulating layer 41, for example comprising a layer of silicon oxide and a layer of silicon nitride or silicon carbide (in FIG. 15, for reasons of simplicity, the individual layers are not illustrated). The insulating layer 41 is then shaped, in particular for exposing the plugs 5 and portions of the substrate 2, where contacts will then be formed, as well as the sacrificial anchoring regions 9 (not visible in FIG. 15; see also FIG. 16).

Figure 16:
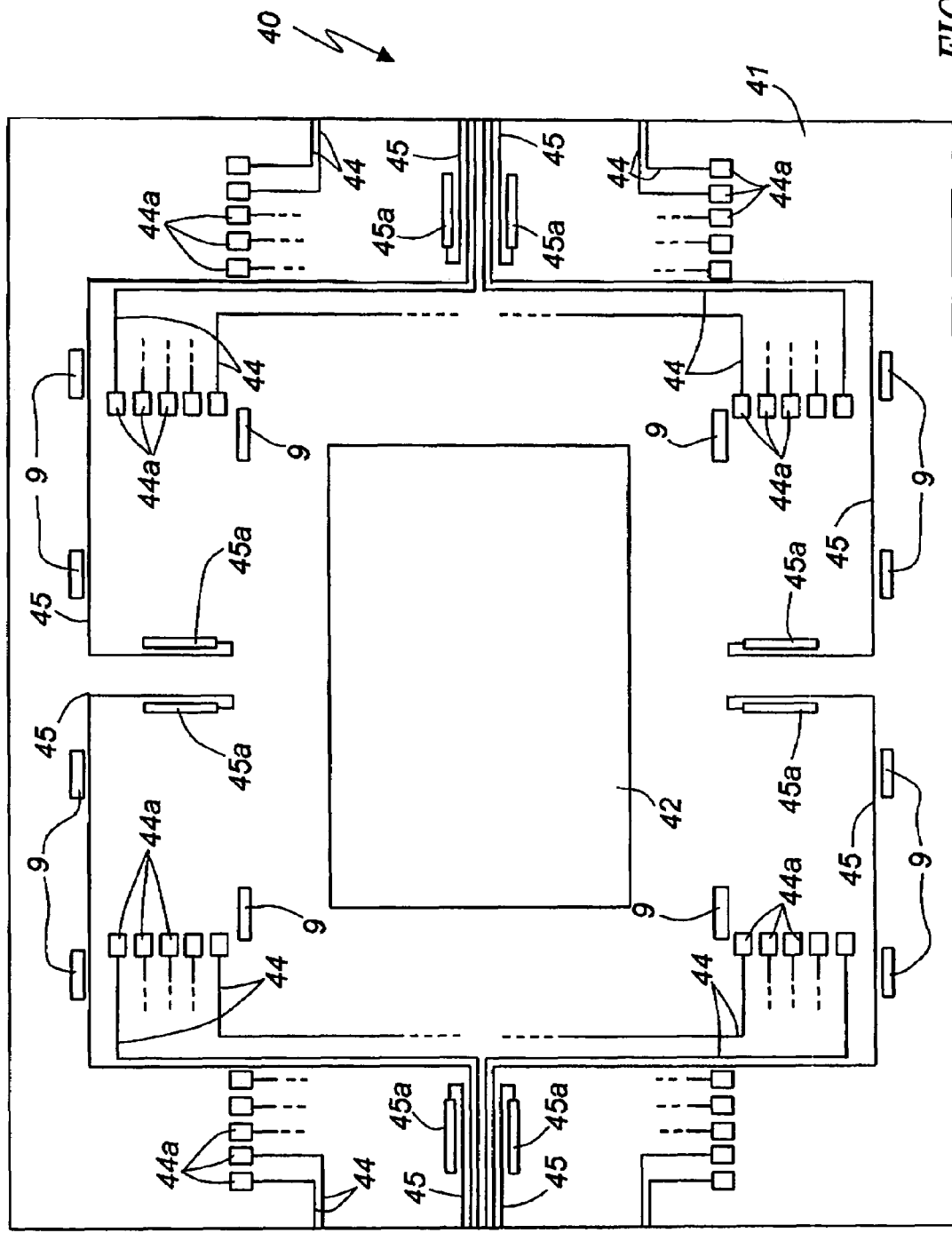
FIGS. 16 and 17 are top plan views of the composite wafer of FIG. 15, in subsequent manufacturing steps.

Deposition and definition of a metal layer 43 then follow for forming a micromirror 42, which is, for example, rectangular or square; first connection lines 44, each terminating with a pad 44a connected to a respective plug 5; and second connection lines 45, terminating with respective contacts 45a (for reasons of simplicity, in FIG. 16 only some of the first connection lines 44 are illustrated).

Next, a third trench etch is performed. In the composite wafer 40, microswitches 100 are thus completed, one of which is illustrated in FIGS. 17 to 20, where the connection lines 44, 45 and the insulating cap 41 have been removed (except in the enlarged detail of FIG. 20); the micromirror 42 is instead illustrated.

The trench etch, which is markedly anisotropic, is terminated after the dielectric layer 7 has been reached. Hence, where etched, the silicon is removed for the entire residual thickness of the substrate 2.

In this step, in the residual portion 2' of the substrate 2, a second external supporting frame 47, which is fixed, and moving supporting parts, in particular, an inner frame 48 and a platform 50, are formed. Furthermore, first, second, third and fourth rotating assemblies 51-54 are formed, each of which comprises a plurality of respective rotating electrodes 60, the said rotating assemblies being coupled with the first, second, third and fourth stator assemblies 20-23, so as to form, respectively, first, second, third and fourth actuators 55-58 (FIGS. 18 and 19, where the dielectric layer 7 is not shown).

The inner frame 48 is constrained to the second outer frame 47 by a pair of first torsional elastic elements 61, opposite to one another, coaxial with the first axis X. The inner frame 48 is constrained to the platform 50 through a pair of second torsional elastic elements 62, opposite to one another, coaxial with the second axis Y. Moreover, the second outer frame 47, the inner frame 48, and the platform 50 are rigidly connected to one another by means of the sacrificial anchoring regions 9, which are not involved in the trench etch. Between the inner frame 48 and the second outer frame 47 there is a space sufficient for allowing the inner frame 48 to rotate about the first axis X without colliding with the second outer frame 47, once the sacrificial anchoring regions 9 have been removed. Likewise, between the platform 50 and the inner frame 48 there is a space sufficient for allowing the platform 50 to rotate about the second axis Y without colliding with the inner frame 48, once the sacrificial anchoring regions 9 have been removed. Clearly, this space depends upon the thickness of the substrate 2 after the lapping operation and, in the example described, is approximately 10 µm.

The second outer frame 47 has on opposite sides a pair of recesses 63, 64 (FIG. 17), which are placed over the recesses 26, 27 of the first outer frame 17 (FIG. 8) and house the first and second rotating assemblies 51, 52, respectively. In greater detail, the rotating electrodes 60 of the first and second rotating assemblies 51, 52 are comb-fingered perpendicularly to the first axis X and are carried by arms 65, which are arranged alongside the first torsional elastic elements 61 and are connected to the inner frame 48. Moreover (FIG. 19), the rotating electrodes 60 of the first and second rotating assemblies 51, 52 are placed over and staggered with respect to the stator electrodes 25 of the first and second stator assemblies 20, 21, respectively.

The inner frame 48 has, on opposite sides facing the platform 50, recesses 68, 69, housing the third and fourth rotating assemblies 53, 54, respectively. In greater detail, the rotating electrodes 60 of the third and fourth rotating assemblies 53, 54 are comb-fingered parallel to the second axis Y and are carried by arms 69, which are arranged alongside the second torsional elastic elements 62 and are connected to the platform 50. In addition (FIG. 20), the rotating electrodes 60 of the third and fourth rotating assemblies 53, 54 are placed over and staggered with respect to the stator electrodes 25 of the third and fourth stator assemblies 22, 23, respectively.

After the trench etch, the composite wafer 40 is cut into individual dice, each comprising a respective microswitch 100 carried on a base 32', as illustrated in FIG. 21. Furthermore, the dielectric layer 7 is removed where exposed, while the sacrificial anchoring regions 9 are completely removed. In greater detail, the sacrificial layer 7 is not etched between the first and the second outer frames 17, 47 and between the inner frame 48 and the protective structures 30 of the stator electrodes 25, where there are located also residual portions of the sacrificial layer 12. In this way, first and second anchoring points 70, 71 are formed, which connect the second outer frame 47 to the first outer frame 17 and, respectively, the inner frame 48 to the protective structures 30. In addition, residual portions 7' of the dielectric layer remain between the interconnection lines 11 and the first frame 48 and function as support also for the stator electrodes 25 (for this purpose, the width of the interconnection lines 11 is chosen according to known criteria according to the thickness of the dielectric layer 7 so as to prevent complete removal of the latter).

Owing to the removal of the sacrificial anchoring regions 9, the inner frame 48 and the platform 50 are freed and are hence movable. In detail, the inner frame 48 can oscillate about the first axis X with respect to the second outer frame 47 (and hence with respect to the rest of the microswitch 100), drawing along the third and fourth actuators 57, 58, and the platform 50 can oscillate about the second axis Y with respect to the inner frame 48. Consequently, the micromirror 42 is tiltable both about the first axis X and about the second axis Y. Moreover, the first and second actuators 55, 56 may be actuated to rotate the inner frame 48 about the first axis X against the action of the first torsional elastic elements 61 both in a clockwise direction and in a counterclockwise direction; likewise, the third and fourth actuators 57, 58 may be actuated to rotate the platform 50 and the micromirror 42 about the second axis Y against the action of the second torsional elastic elements 62 both in a clockwise direction and in a counterclockwise direction (in practice, in each of the actuators 55-58 the stator electrodes 25 can be biased so as to attract the overlying rotating electrodes 60; the actuators 55-58 moreover have axial symmetry and are hence controllable for impressing both clockwise and counterclockwise rotations).

Figure 18:
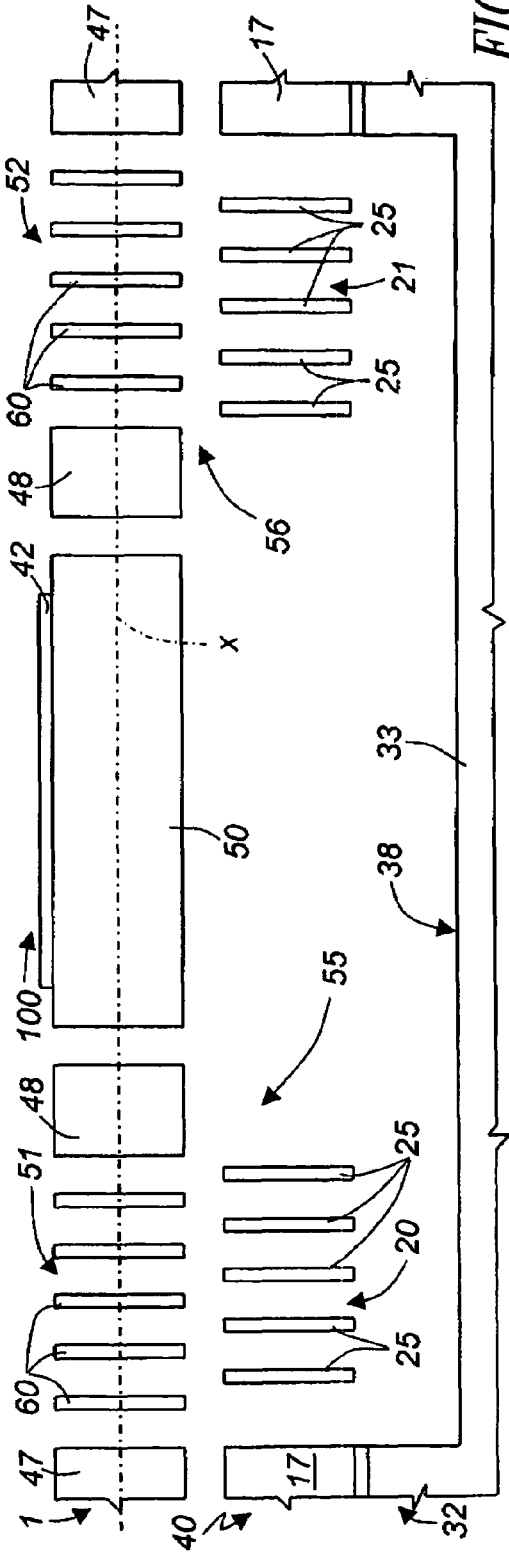
Figure 17:
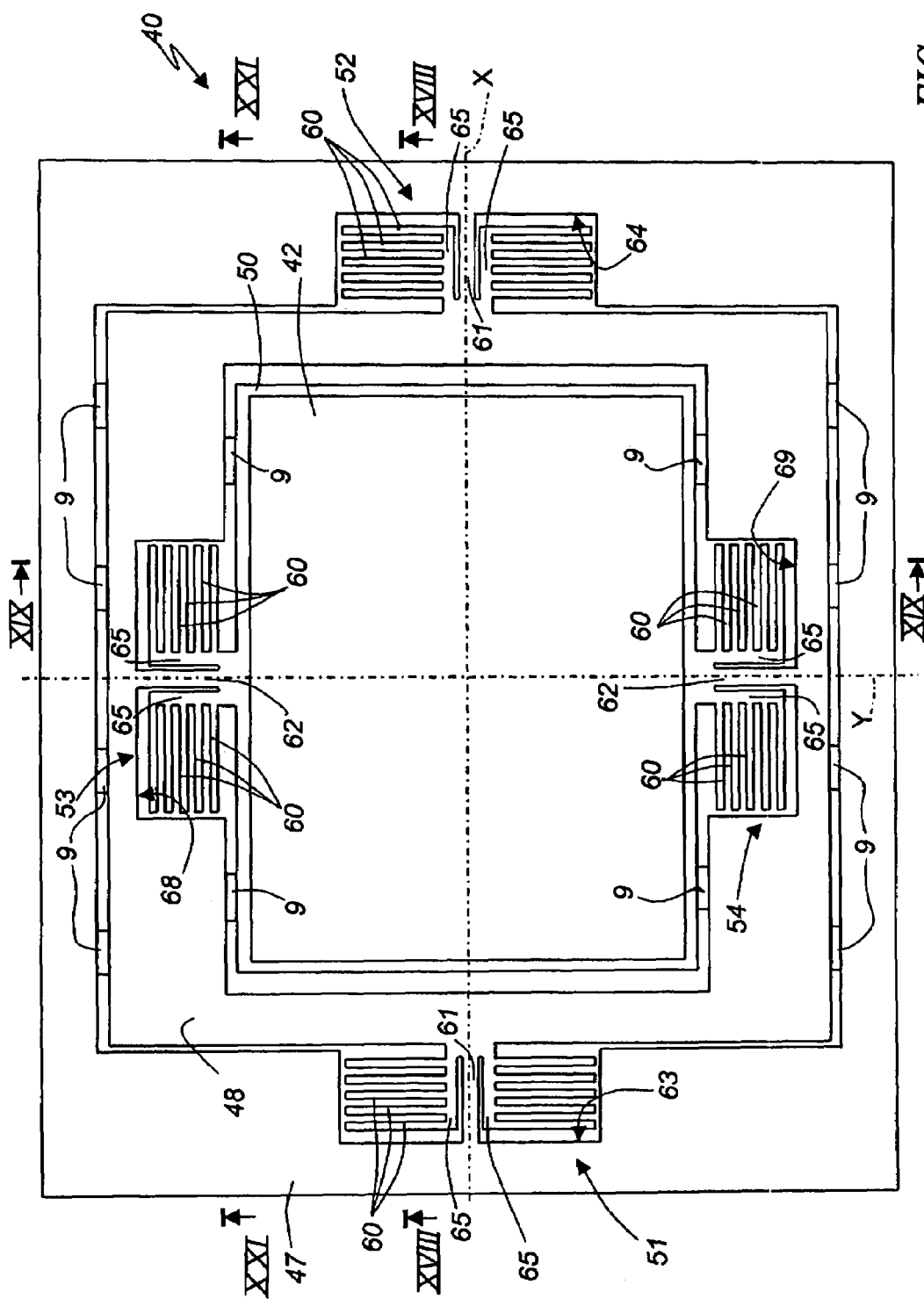
Figure 20:
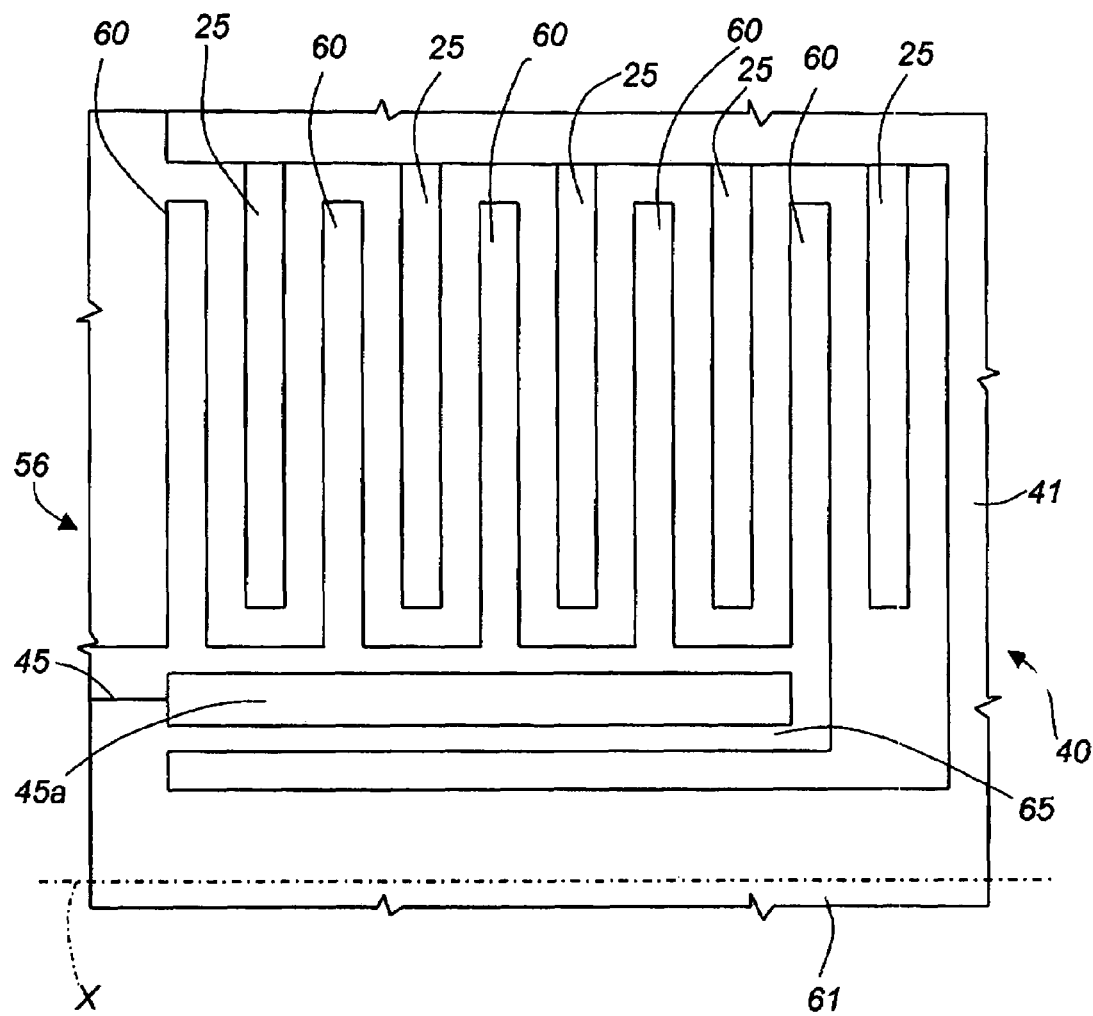
FIG. 20 illustrates an enlarged detail of the composite wafer of FIG. 17.

The connection lines 44, 45 for biasing the stator electrodes 25 and the rotating electrodes 60 of the actuators 55-58, which in FIGS. 17, 18 and 19 are not illustrated, are developed on top of the second outer frame 47, the inner frame 48 and the torsional elastic elements 61, 62. The contacts 45a (not shown either) are carried by the arms 65.

The method described affords the advantages explained hereinafter. In the first place, the need to fill the spaces between the moving parts and the fixed parts with silicon oxide for immobilizing the moving parts during the manufacturing is overcome and, consequently, also the drawbacks due to the long thermal oxidation steps required for this purpose are eliminated. In fact, the moving parts defined starting from the substrate 2 of the first wafer 1 (inner frame 48, platform 50 and rotating assemblies 51-54) are formed only after bonding of the first and second wafers 1, 32, and thinning of the first wafer 1. Moreover, the moving parts formed in the polysilicon layer 16 (stator assemblies 22, 23) are kept immobilized until the substrate 2 of the first wafer 1 is etched. The method according to the invention thus enables adequate spaces to be left between the moving parts and the fixed parts, so improving the freedom of movement and reducing the risks of collisions. The freedom of movement is increased also because in the second wafer 32 there is the cavity 35: in this way, the inner frame 48 and the platform 50 can rotate by greater angles.

The method is therefore particularly suitable for the construction of devices in which the moving part must rotate about a number of non-parallel axes, as in the case of optical microswitches, or in any case about an axis not perpendicular to the surface of the wafer. Furthermore, devices having high density of electrodes can easily be formed, preventing the risk of the lateral growth of the thermal oxide deforming the wafers.

Further advantages are afforded by the use of the plugs and of the interconnection lines of polysilicon between the substrate and the polysilicon layer of the first wafer. In fact, the interconnection lines integrated in the first wafer can be defined with extremely high precision. It is thus possible to obtain devices with a high density of electrodes, which are insulated from one another and can be biased independently through respective dedicated connection lines. In the embodiment described, in particular, the stator electrodes 25 can be biased independently: it is hence possible to modify the number of electrodes 25 activated for controlling the pair supplied by the actuators 55-58. In traditional methods, instead, the connection lines are formed in the second wafer and hence their density is limited by the tolerances of alignment in the step of bonding of the first and second wafers: it is necessary, in fact, to prevent the risk of making faulty connections.

Finally, it is evident that modifications and variations can be made to the device described herein, without departing from the scope of the present invention. In the first place, the method can be used for making micro-electro-mechanical devices of a type different from the one described herein, in particular, micromotors, linear and/or rotational microactuators, inertial sensors and pressure sensors.

In addition, the moving parts can rotate about axes that are differently oriented and possibly not orthogonal to one another. For example, the axes could be one perpendicular and one parallel to the free face of the first wafer.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for manufacturing a micro-electro-mechanical device, which has supporting parts and operative parts, comprising:
   providing a first semiconductor wafer, having a first layer of semiconductor material, and a second layer of semiconductor material, arranged on said first layer;
   forming first supporting parts and first operative parts of said device in said second layer;
   bonding said first wafer to a second wafer, with said second layer facing said second wafer; and
   forming, after the bonding step, second supporting parts and second operative parts of said device in said first layer.

2. The method according to claim 1 wherein said step of forming second supporting parts and second operative parts comprises:
   thinning said first layer; and
   anisotropically etching a residual portion of said first layer.

3. The method according to claim 1 wherein said first operative parts are electrostatically coupled to respective said second operative parts.

4. The method according to claim 1 wherein said first and second supporting parts comprise fixed supporting parts and moving supporting parts.

5. The method according to claim 1, comprising the step of forming elastic elements connecting said supporting parts and said operative parts.

6. The method according to claim 5 wherein said step of forming elastic elements comprises forming said elastic elements in said first layer.

7. The method according to claim 6 wherein said elastic elements comprise first torsional elastic elements, aligned to a first axis, and second torsional elastic elements, aligned to a second axis.

8. The method according to claim 1 wherein said step of providing said first wafer comprises forming interconnection lines arranged between said first layer and said second layer.

9. The method according to claim 8 wherein said step of forming interconnection lines comprises:
   forming a conductive layer on said first layer; and
   shaping said conductive layer.

10. The method according to claim 8, comprising the step of making, in said second layer, through interconnections connected to said interconnection lines.

11. The method according to claim 1, comprising, prior to said step of forming second supporting parts and second operative parts:

depositing a metal layer on a face of said first layer opposite said second layer; and shaping said metal layer.

12. The method according to claim 1, comprising:

forming sacrificial anchoring structures connecting said first and second supporting structures and said first and second operative structures, to prevent corresponding movements;

cutting said wafer into a plurality of dice, each die comprising a respective micro-electro-mechanical device; and removing said sacrificial anchoring structures.

13. A method for manufacturing a micro-electro-mechanical device, comprising:

defining, in a first semiconductor substrate, a plurality of anchor regions;

bonding a second semiconductor substrate to the first substrate;

forming, after the bonding and defining steps, a rotor region in the first semiconductor substrate such that the anchor regions remain between the rotor region and an outer region of the first substrate; and removing the anchor regions such that the rotor region is free to move with respect to the outer region and the second substrate.

14. The method of claim 13, comprising:

forming a layer of semiconductor material on the first semiconductor substrate; and forming electrostatic stator elements in the layer of semiconductor material;

and wherein the bonding the second semiconductor substrate to the first substrate step comprises bonding the second semiconductor substrate to the layer of semiconductor material, and the forming the rotor region in the first semiconductor substrate step comprises forming electrostatic rotor elements in the first semiconductor substrate.

15. The method of claim 13, comprising:

cutting, prior to the removing the anchor regions step, the first and second semiconductor substrates into a plurality of individual dice.

* * * * *